United States Patent [19]

Ahuja

[11] Patent Number: 4,700,380
[45] Date of Patent: Oct. 13, 1987

[54] SOLID STATE REMOTE ACTUABLE SWITCH

[76] Inventor: Om Ahuja, 89 Clearmeadow Dr., East Meadow, N.Y. 11554

[21] Appl. No.: 753,709

[22] Filed: Jul. 10, 1985

Related U.S. Application Data

[63] Continuation-in-part of Ser. No. 633,107, Jul. 20, 1984, abandoned.

[51] Int. Cl.⁴ .................................... H04M 3/20
[52] U.S. Cl. ............................... 379/177; 379/26; 379/387
[58] Field of Search .................. 179/175.3 R, 175.3 F, 179/175, 175.1 R, 81 R, 17 A, 99 R, 17 E, 17 B; 307/252 B, 252 T; 324/52, 525

[56] References Cited

U.S. PATENT DOCUMENTS

| | | | |
|---|---|---|---|
| 3,916,111 | 10/1975 | Ott ............................. | 179/17 E |
| 4,021,617 | 5/1977 | Jones, Jr. et al. ............... | 179/17 E |
| 4,052,624 | 10/1977 | Hamstra ........................ | 307/252 B |
| 4,054,942 | 10/1977 | Chambers, Jr. ................. | 179/17 A |
| 4,056,694 | 11/1977 | Brolin .......................... | 179/84 R |
| 4,079,205 | 3/1978 | Glenn .......................... | 179/17 A |
| 4,099,031 | 7/1978 | Proctor et al. ................. | 179/17 A |
| 4,149,040 | 4/1979 | Atkinson ...................... | 179/17 A |
| 4,209,667 | 6/1980 | Simokat ....................... | 179/17 A |
| 4,221,935 | 9/1980 | Barsellotti et al. ............. | 179/17 E |
| 4,293,737 | 10/1981 | Cepelinski .................... | 179/17 E |
| 4,310,723 | 1/1982 | Svala .......................... | 179/17 A |
| 4,323,799 | 4/1982 | King et al. .................... | 307/571 |
| 4,324,953 | 4/1982 | Simokat ....................... | 179/17 A |
| 4,331,838 | 5/1982 | Simokat ....................... | 179/17 E |
| 4,373,121 | 2/1983 | Sartori et al. ................. | 179/175.3 F |
| 4,396,809 | 8/1983 | Brunssen ...................... | 179/175.3 F |
| 4,403,115 | 9/1983 | Simokat ....................... | 179/17 A |
| 4,438,299 | 3/1984 | Tomin ......................... | 179/175.3 F |
| 4,445,001 | 4/1984 | Bertoglio ...................... | 179/17 A |
| 4,489,221 | 12/1984 | Walker et al. .................. | 179/19 |
| 4,529,847 | 7/1985 | DeBalko ....................... | 179/175.3 F |

OTHER PUBLICATIONS

*General Electric*, published by Prentice Hall Inc., N.J., "SCR Manual Sixth Edition", pp. 435–436.
*Bell Laboratories Record*, "Switching to Solid State Relays", pp. 31–37, published in Feb. of 1978.
Disclosure Document No. 119121, filed Jul. 27, 1983 for "Maintenance Termination Unit", (Per Bell Pub: 55022).

*Primary Examiner*—Stafford D. Schreyer
*Attorney, Agent, or Firm*—Scully, Scott, Murphy & Presser

[57] ABSTRACT

A solid state remotely actuable switch includes at least one solid state bilateral switch having a first and a second terminal connected in series with the telephone circuit and a gate for rendering the switch conductive between the terminals in response to a specific gate trigger current. A solid state unilateral switch is provided for each bilateral switch, which includes first and second terminals and a gate for actuating the unilateral switch between the terminals in response to a telephone operation voltage. A diode bridge circuit having positive and negative terminals connects the gate and second terminal of the bilateral switch to the first and second terminals of the unilateral switch. A solid state avalanche device is connected between the first terminal of the unilateral switch and the positive terminal of the bridge circuit. The unilateral switch is rendered nonconductive in response to a control signal from the central office to render the bilateral switch nonconductive for disconnecting the remote circuit.

40 Claims, 12 Drawing Figures

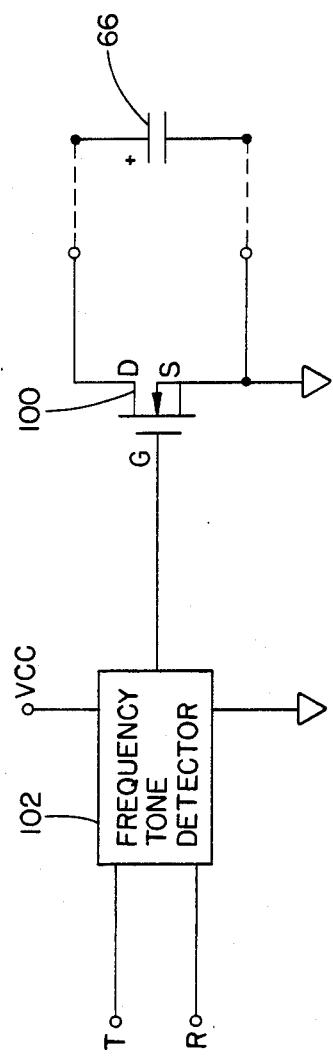
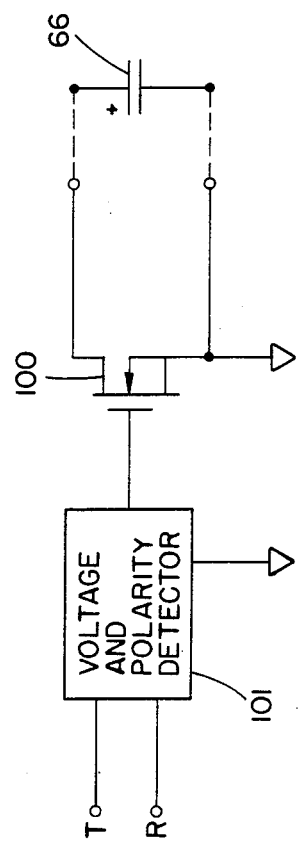

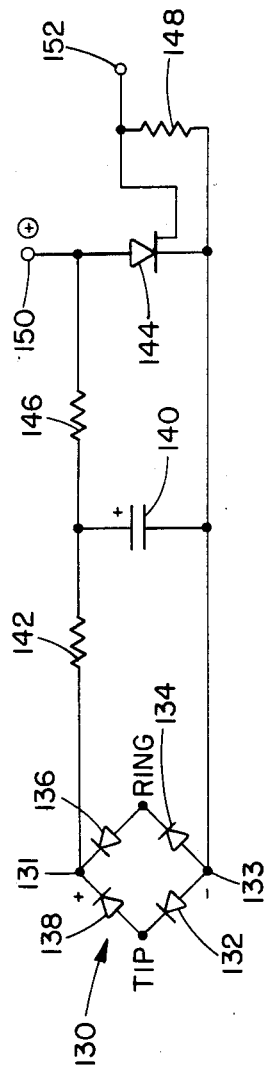
FIG.7
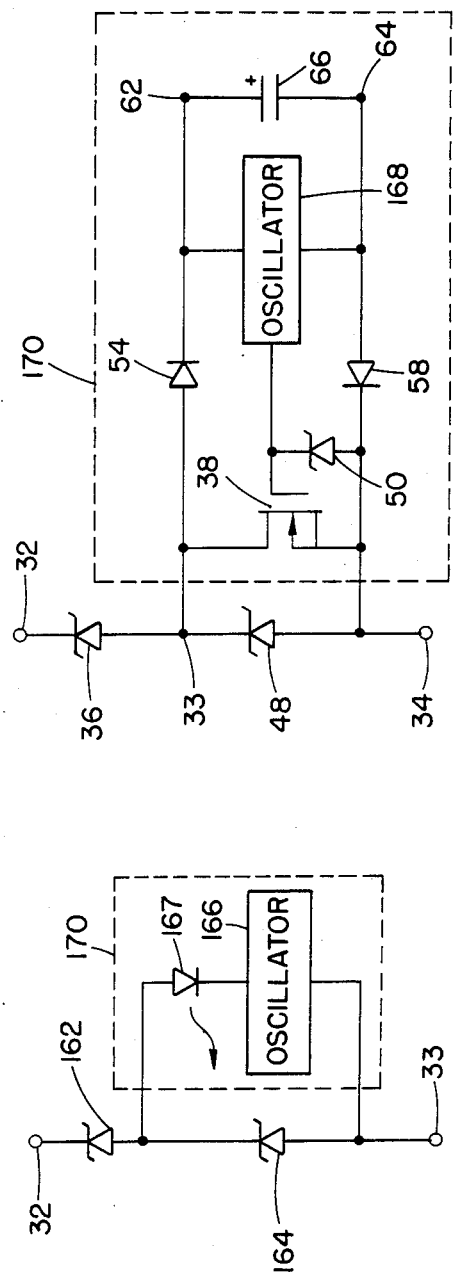
FIG.8b
FIG.8a

SOLID STATE REMOTE ACTUABLE SWITCH

CROSS REFERENCE TO RELATED APPLICATION

This application is a continuation-in-part of the applicant's U.S application Ser. No. 633,107, filed July 20, 1984 abandoned.

BACKGROUND OF THE INVENTION

This invention relates generally to the field of telephone communications, and more particularly to a variety of solid state switches to be used as series elements in telephone lines between the telephone central office and the subscribers.

In the past, many solid state switches have been designed and applied in the various fields using relays, darlingtons, or bipolar transistors. However, these switches are not desirable for telecommunications because they require heavy base currents to keep them "on" or a power source to actuate them. If a remote power source is required, then electrical service must be provided within the customer's house at the point of network line termination. Darlington switches may be used to reduce the above-referenced base current requirement, but there is a large voltage drop across a Darlington solid state switch. These solutions are not acceptable, especially where the subscriber is at a distance away from the central office. Due to the long loop length and large voltage drop in the line, a solid state switch would normally add undesirable voltage drop to the already low current made available for the talk circuit.

DESCRIPTION OF THE PRIOR ART

U.S. Pat. No. 4,323,799 issued to King et al., discloses a time delay remote disconnect switch for use in a telephone system. The switch includes a field effect transistor (FET) that is switched on and off by the voltage produced by an illuminated series connected photodiode array connected to the FET. A resistive-capacitive timing circuit determines the time interval between the on and off states of the FET.

U.S. Pat. No. 4,373,121 issued to Satori, et al. discloses a fault detection device having as four layer diode switch connected in series with each of the subscriber loop conductors, tip and ring, of the telephone lines. In addition, identical impedance networks are connected between the loop conductors and ground on the telephone utility side of the switches. Each of the networks presents a unique impedance in response to an AC signal. In a first set of tests DC signals are applied to the loop conductor to determine if a fault exists. In addition, AC signals are also applied to the loops and if the unique impedance is detected it is determined that an MTU device is in the line. In order to determine where a problem exists, a second set of DC signal tests are performed wherein the voltage is dropped to below the threshold voltage of the four layer diodes so that the diodes will not conduct. If a DC current is detected, the problem exists on the utility side of the line.

In U.S. Pat. No. 4,438,299 issued to Tomin, a telephone trouble shooting apparatus is disclosed having two voltage sensitive unilateral solid state switches, one connected to the tip line and other connected to the ring line. Each of the unilateral switches has a blocking diode for blocking conduction in the direction running opposite that of the direction of conduction of the unilateral voltage sensitive switches. A termination circuit consisting of a resistor 22 and a diode 24 is connected across the tip and ring lines. By using a test voltage below that which the solid state switches will conduct, the customer side of the line is disconnected. Depending on whether or not the resistor 22 or an open circuit is detected upon testing in opposite polarities, it can be determined whether the problem exists on the company side or on the customer side on the apparatus.

SUMMARY OF THE INVENTION

Numerous circuits related to the telephone loop are presented here which embody the instant invention. The different applications are dealt with appropriately in the description of each individual circuit The solid state switch in each case performs the function of disconnecting the subscriber side of the equipment from the network/central office side of the equipment.

The present invention employs solid state unilateral and bilateral switches having a gate for rendering the switch conductive in response to predetermined control voltages and/or currents. Bilateral switches are in turn actuated by one or more devices in response to control signals from the telephone central office.

The present invention provides two different approaches to solving the problem:

(a) Sensitive gate triacs are used in the case where on demand the triac is fired (triggered) and once in the "on" state the same remains "on" until the loop current drops below the holding current of the device.

(b) By using FETs which require minimal power to turn them "on", and keep them on, the power will be supplied by the voltage available across the line. No external power is thus required to keep these devices in the "on" or the "off" state. Furthermore, the switches utilize minimum current generating circuitry.

The remotely actuable switch of the present invention is used for disconnecting a remote telephone circuit to control the subscriber side of the system. The switch is operative to permit normal phone operation, but has a remote control means for selectively disabling the switch. The remote disconnect switch normally passes both AC and DC signals in response to a pilot signal. The AC being present during ring conditions, and the DC also known as central office (c.o.) battery or talk battery being present at all times. The remote disconnect switch enables the central office to test the line for faults, to selectively deny the subscriber access to the telephone line or to provide selective ringing on a multi-party line.

The remotely actuable switch includes at least one solid state bilateral switch that normally passes both AC and DC signals in response to a pilot signal. The bilateral switch includes a first and a second terminal connected in series with the remote circuit, and a gate for rendering the switch conductive between the terminals in response to a specific gate trigger current. The bilateral switch is sustained conductive in response to a holding current. A field effect transistor switch means is provided for each bilateral switch, being responsive to the normal operative telephone signals to generate a pilot signal for the bilateral switch. The FET switch includes first and second terminals and a gate for actuating the unilateral switch between the terminals in response to the normal AC and DC telephone signals. The FET switch selectively disables said bilateral switch in response to a control signal from the central office. A diode bridge circuit having positive and negative terminals connects the gate and second terminal of the bilateral switch to the first and second terminals of the FET switch. The bridge provides the proper polarity to the unilateral switch regardless of the polarity of the telephone circuit.

A solid state avalanche device is connected between the first terminal of the unilateral switch and the positive terminal of the bridge circuit to render the bilateral switch top sensitive. The avalanche device will not permit the gate trigger current to flow unless the voltage across the bilateral switch is equal to a predetermined threshold voltage. The threshold voltage must exceed the breakover voltage of the avalanche device plus the gate trigger voltage of the bilateral switch and the voltage drops across two diodes of the diode bridge circuit.

The remotely actuated switch is actuated by rendering the FET switch conductive. When conducting, the FET switch allows the gate trigger current to flow to render the bilateral switch conductive. A circuit means is provided to actuate the FET switch in response to the normal operative telephone signal from the central office. The operative signal may be either the DC talk battery voltage or AC ringing voltage. The gate of the FET switch is connected to the positive terminal of the diode bridge for rendering the FET switch conductive in response to the operative signal.

The remotely actuated switch is disabled by rendering the FET switch nonconductive. The remotely actuated switch is then rendered nonconductive by removing the voltage across the telephone circuit to drop the current below the holding current of the bilateral switch. If the FET switch is nonconductive there will be an open circuit between the gate and second terminal of the bilateral switch thereby preventing the gate trigger current from flowing. Thus, the remote switch will be sustained nonconductive for as long as the FET switch is nonconductive, thereby disconnecting the subscriber from the telephone circuit.

Several disconnect means are disclosed herein for rendering the FET switch nonconductive. The disconnect means apply a short across the gate and the second terminal of the FET switch to discharge and open the FET switch. The means for disconnecting the switch may utilize polarity decoding, frequency decoding, or DC activated circuits, both latching and nonlatching. In each case, the switch is remotely actuated by polarity encoding, frequency encoding or specific voltages supplied from, the central office.

BRIEF DESCRIPTION OF THE DRAWINGS

FIG. 3a is a schematic diagram of one embodiment of the discharge mechanism for a tone activated device.

FIG. 3b is a schematic of a polarity decoding discharge mechanism.

FIG. 7 is a schematic diagram of a latching circuit for a discharging circuit.

FIGS. 8a to 8b are schematic diagrams of wiggle circuits for an MTU device.

DETAILED DESCRIPTION OF THE INVENTION

Figure 1:
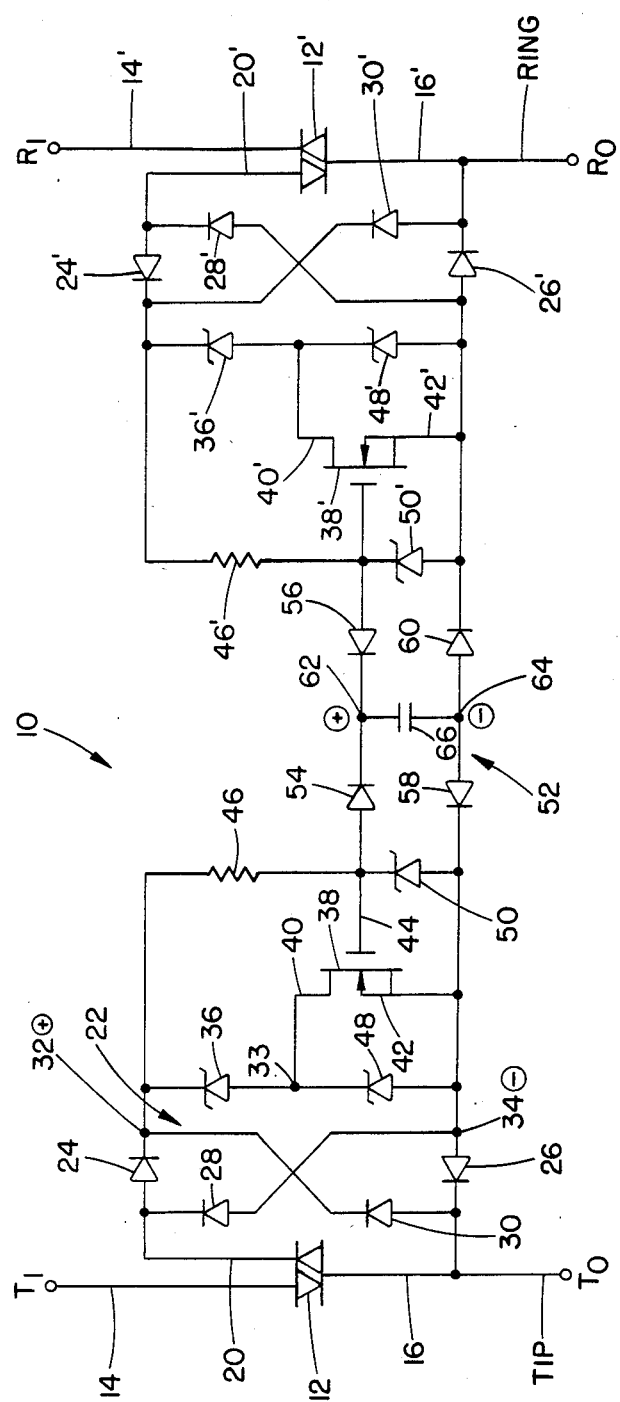
FIG. 1 is a schematic diagram of one embodiment of the remotely actuable switch of the present invention.

Referring to the drawings, FIG. 1 shows a schematic diagram of the remotely actuable switch 10. The switch 10 shown in FIG. 1 is symmetrical which in this sense means there are identical circuits connected within two legs of a remote tip and ring circuit. $T_0$ and $R_0$ signifies the central office side of the switch 10 and $T_1$ and $R_1$ signifies the customer side of the switch 10. $T_1$ is connected to $R_1$ through the customer phone. To simplify the description, only one side of the switch 10 will be described, with the identical circuitry in each leg being designated with a prime. The switch 10 includes a bilateral solid state switch 12 having a first terminal 14 and a second terminal 16 connected in series within the tip line. The bilateral switch 12 also includes a gate 20 that renders the switch 12 conductive between terminals 14 and 16 in response to a specified gate trigger current. A diode bridge 22 including diodes 24, 26, 28, and 30, is connected between the gate 20 and terminal 16 of the switch 12. The bridge 22 has a positive terminal 32 and a negative terminal 34.

An avalanche device 36 and a unilateral switch 38 are connected in series across the positive and negative terminals 32 and 34 of the bridge 22. The unilateral switch 38 includes first and second terminals 40 and 42 that are connected in series with the avalanche device 36. The switch 38 further includes a gate 44 for actuating the unilateral switch 38 in response to a normal telephone operative signal such as the DC talk battery voltage or the AC ringing voltage. The avalanche device 36 is connected between the positive terminal 32 of the bridge 22 and the first terminal 40 of the unilateral switch 38. The avalanche device 36 is connected to normally conduct in a direction from the negative to the positive terminals of the bridge 22 and will conduct in the direction from the positive to the negative only when the voltage exceeds the breakover voltage of the avalanche device 36.

A circuit means is provided to supply the voltage to the gate 44 for actuating the unilateral switch 38 in response to a normal operative signal from the central telephone office. In the illustrative embodiment shown in FIG. 1, the gate 44 of the switch 38 is connected to the positive terminal 32 of the bridge 22 to provide the operative voltage. A resistor 46 may be connected between the terminal 22 and the gate 44 in order to limit the current to the gate 44 of switch 38. As a further protection measure, a zener diode 48 may be connected across the first and second terminals 40 and 42 of the switch 38 in order to limit the voltage across the switch 38. Similarly, a zener diode 50 protects the gate 44 by limiting the voltage across the gate.

The remotely actuable switch 10 is further controlled by providing a circuit means for deactivating the unilateral switch 38. The deactivating circuit means, not shown in FIG. 1, is connected across the gate 44 and the second terminal 42 of the switch 38 to discharge the gate voltage and render the switch 38 nonconductive. In the illustrative embodiment shown in FIG. 1, a diode bridge 52 including diodes 54, 56, 58 and 60, having positive and negative terminals 62 and 64, is connected between the gate 44, 44' and the second terminal 42, 42' of switches 38, 38'. The deactivating circuit means will then be connected across the positive and negative terminals of the bridge 52 in order to deactivate switches 38 and 38'. A capacitor 66 may be connected between the positive and negative terminals 62 and 64, and the circuit deactivating means may act to provide a short across the capacitor to discharge the gate of the switch 38.

In the illustrative embodiment of FIG. 1, the bilateral switch 12 is a triac. The avalanche device 36 is shown as a zener diode. The unilateral switch 38 is a field effect transistor (FET), preferably an n-channel FET.

In operation, the remotely actuable switch 10 is turned on by an operative voltage supplied from the telephone central office across the tip and ring circuit. The operative voltage is rectified through the bridge rectifier 22 and appears across the positive and negative terminals 32 and 34 of the rectifier 22. The diode bridge 22 permits the switch 38 to be turned on regardless of the polarity of the voltage within the tip and ring circuit. For example, when tip is positive, the diode 30 will conduct the positive potential to the terminal 32 and that positive potential will then be across 36 and 38. That same potential is conducted through the resistor 46 to the gate 44 of the FET 38 to turn on the FET 38. Once the FET 38 is turned on, the diode 28 will conduct to the gate 20 of the triac 12 putting the operative voltage potential across the switch 12. However; the switch 12 will not be turned on unless there is a demand for current. The demand for current is produced when subscriber takes the phone off hook. In addition, when the central office applies the ringing voltage across tip and ring, the current flow produced by the ringer mechanism in the phone is sufficient to trigger the switch 12 on.

The operative voltage of the central office must exceed a predetermined threshold voltage in order to cause the avalanche device 36 to conduct. The threshold voltage must exceed the breakover voltage of the avalanche device 36 plus a gate trigger voltage of the bilateral switch 12 and the voltage drops across two of the diodes in the bridge circuit 22. When this threshold voltage is provided, and there is a demand for current, the bilateral switch 12 will be rendered conductive and will stay on regardless of the voltage within the remote circuit unless the current is reduced to below the rated holding current of the device 12.

The control feature of the switch 10 is provided by remotely turning off the unilateral switch 38 when the switches 12 are off. The switch 38 is turned off by a control voltage from the central office that activates a discharge mechanism that presents a short across the gate 44 and the second terminal 42 of the switch 38 to discharge the FET 38. In the case of a DC disconnect device, the control voltage is applied across tip and ground or ring and ground so there is no voltage from tip to ring to produce a current flow in the switches 12. The output of the disconnect mechanism is across terminals 62 and 64 of the switch 10 and the short is applied to turn off the FET 38. When a capacitor is connected across 62 and 64 the capacitor 66 will hold the short circuit for a predetermined time depending on the RC time constant of resistor 46 and capacitor 66. During the time period it takes for the capacitor 66 to recharge, the central office can then test the line for faults across tip and ring in any polarity.

In other cases, switches 12, 12' may be on and would have to be turned off before the control means of switch 10 could be actuated. The central office can turn off switches 12, 12' by removing the voltage source to the line to interrupt the flow of current through the switch 12, or by putting a short across tip and ring on the network side of the switch 10 to bypass the flow of current going to the switches 12. The short across terminals 62 and 64 may be supplied prior to or at the instant the current is interrupted through switches 12. Then if the voltage is reapplied to the line the switches 12 will not turn on because of the short across the FET 38. The diode bridge 52 provides a means for requiring only one disconnect mechanism to disconnect the switches 12 and 12' in both the tip and ring line. No matter what the polarity of tip and ring, the short across terminals 62 and 64 will put a short across gates 44 and 44' to turn both the switches 38 and 38' off.

Figure 2:
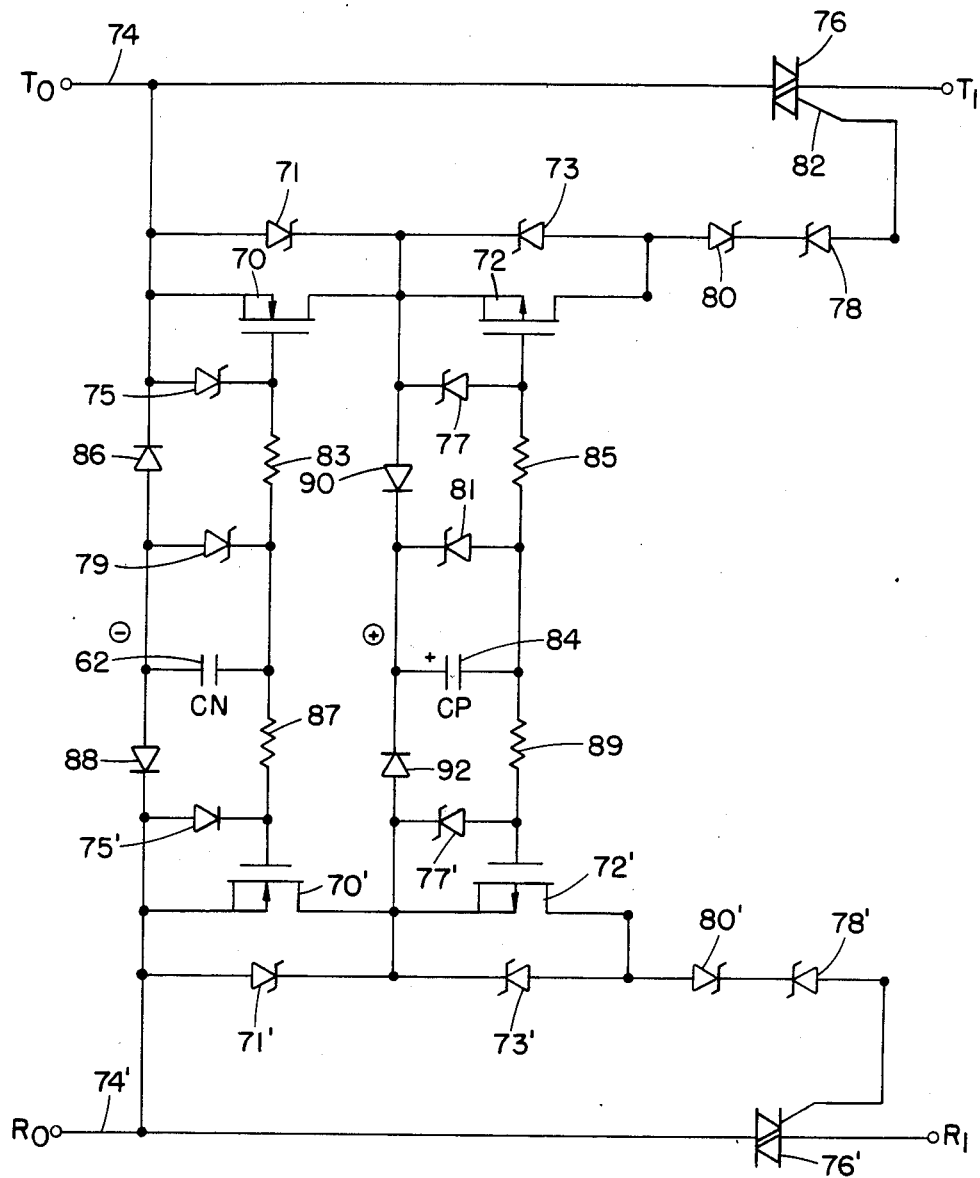
FIG. 2 is a schematic diagram of a bilateral remotely actuable switch.

FIG. 2 shows another embodiment of the solid state switch in the present invention wherein in place of the diode bridge 22 there is incorporated a pair of FET switches 70 and 72, and 70' and 72' connected in series with two avalanche devices 78 and 80 and 78' and 80' respectively. The avalanche devices are connected between the gate 82 and 82' of triac 76 and 76' and the To and Ro line, respectively. As in FIG. 1, the circuit of FIG. 2 is symmetrical with respect to the tip and ring circuits. The FET switches 70, 70' are n-channel FETs and the FET switches 72, 72' are p-channel FETs and permit conduction in both directions between tip and ring. Each FET includes a source drain protective zener 71, 71' and 73, 73' and a gate protective zener 75, 75' and 77, 77'. Similar to FIG. 1, the shorting of the capacitors 82 or 84 will turn off the respective FETs 70, 70' or 72, or 72'. This provides the control of preventing the triac 76, 76' from turning on by not permitting current to flow to the gate 82, 82' of the triac 76, 76'. The FETs will remain off for the time constant formed by the capacitors 82 and 84 with the resistors 83, 87, 85 and 89. The diode bridge formed by diodes 86, 88, 90 and 92 perform the same function as bridge 52 in FIG. 1 to permit the FETs to be turned off regardless of polarity of tip and ring.

In operation, if tip is positive FET 70 will be reverse conducting so that zener 71 conducts. FET 72 must be turned on in order to permit the turn on of the switch 76. Diode 90 provides a reference to the capacitor 84 to pull the gate of the FET 72 to the negative or ring voltage. FET 70' is turned on by the positive potential through diode 75 resistors 83 and 87 to the gate of FET 70'. This completes the circuit between the gate of 72 and the ring line Ro to turn on FET 72. The turning on of the FETs 70, 70', 72 and 72' is selectively controlled through the charging and discharging of the capacitors 82 and 84 by a disconnect means as mentioned above.

FIGS. 3a, 3b, 4, 5, 6a and 6b show various discharge mechanisms for the switches shown in FIGS. 1 and 2. FIG. 3a shows a FET 100 wherein the source and drain terminals are connected across the capacitor 66 of the switch 10 of FIG. 1 and the gate is connected to a frequency detecting or decoding means 102. In this embodiment, the central office can activate and deactivate the switch 10 by sending a signal having a particular frequency that is decoded by the decoding means 102. In addition, as mentioned above, the decoding means 102 will also provide the momentary short across tip and ring to deactivate the switch 10. FIG. 3b shows the discharge mechanism including a voltage and polarity detection circuit 101 which is actuated by a polarity encoding imposed on the control signal from the central office.

In one embodiment, the central office intending to disconnect the customer for testing the network side of the telephone line will send a specific signal which is then decoded by the frequency decoding means 102 or the polarity detection means 101 which are in standby under specific conditions. Having decoded the signal for a specific amount of time, typically 4 seconds, to insure that it was not a stray noise or signal, decoding means 101 or 102 will momentarily turn on FET 100 which instantaneously discharges capacitor 66. This immediately causes the FETs 38 or 38', which are "on" at that instant, to turn off. FETs 38 or 38' will stay off until the capacitor 66 is charged up to the specific gate turn-on voltage of the specific FET. The charge time is a function of the RC time constant of the resistor 42 and the capacitor 66, typically set to be 30 seconds, which is sufficient amount of time for the central office test equipment to test fully the network side of the line. As will be later described, a termination circuit may also be added to the network side or the customer side of the telephone line to enhance the interpretation of the test results.

In yet another embodiment, the decoding means 101 or 102 may be designed to decode two or more specific signals from the central office. For example, upon receiving one signal, the decoding means 102 may turn on FET 100, thus, turning off remote switch 10. It then will remain latched, or keep FET 100 on and therefore switch 10 off, until it receives yet another signal from the central office or under other built-in logic conditions to restore the line to normal conditions. Again, after the release of the FET 100, the usual RC time constant will continue to keep the switch 10 off.

Figure 4:
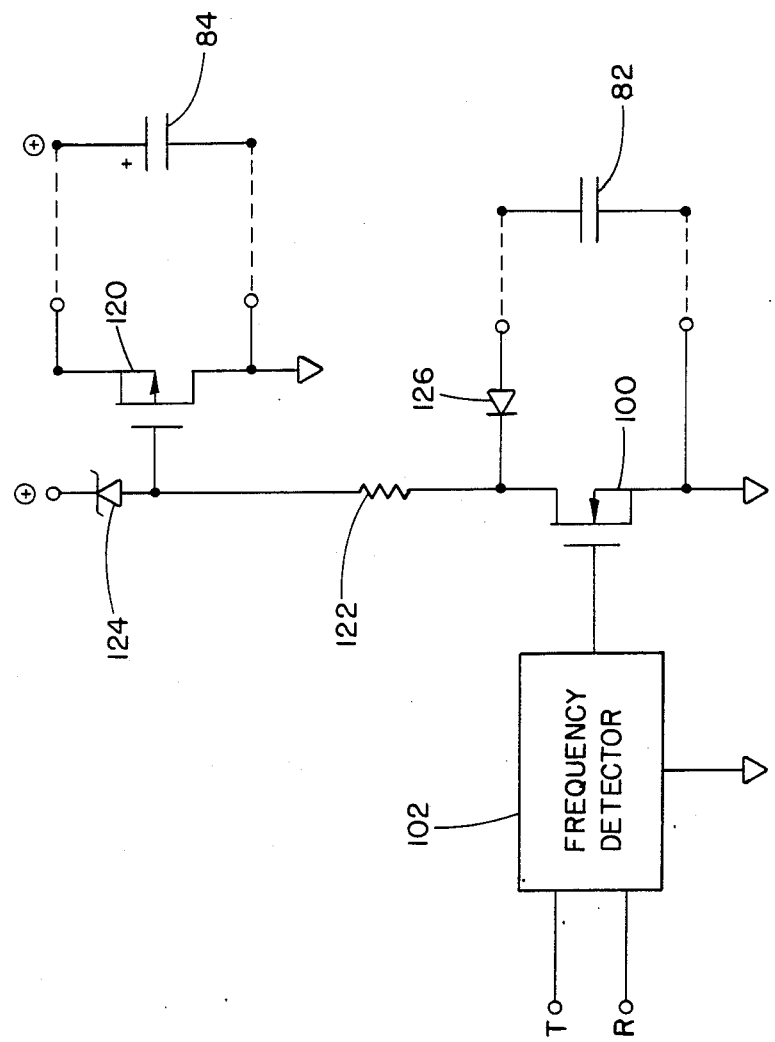
FIG. 4 is a schematic diagram of the discharge mechanism for the bilateral switch of FIG. 2.

FIG. 4 shows the discharge mechanism of FIG. 3 adapted for use with the bilateral switch of FIG. 2. FETs 100 and 120 are connected across capacitors 82 and 84, respectively. The drain terminal of FET 100 is connected to the gate of FET 120 through a resistor 122. A zener diode 124 provides gate protection for FET 100 while diode 126 prevents FET 100 from being turned on other than by FET 120. FET 120 is connected to the frequency decoding means 102 to discharge capacitors 82 and 84 in response to a particular frequency signal from the central office, similar to the operation described for FIGS. 3a and 3b.

Figure 5:
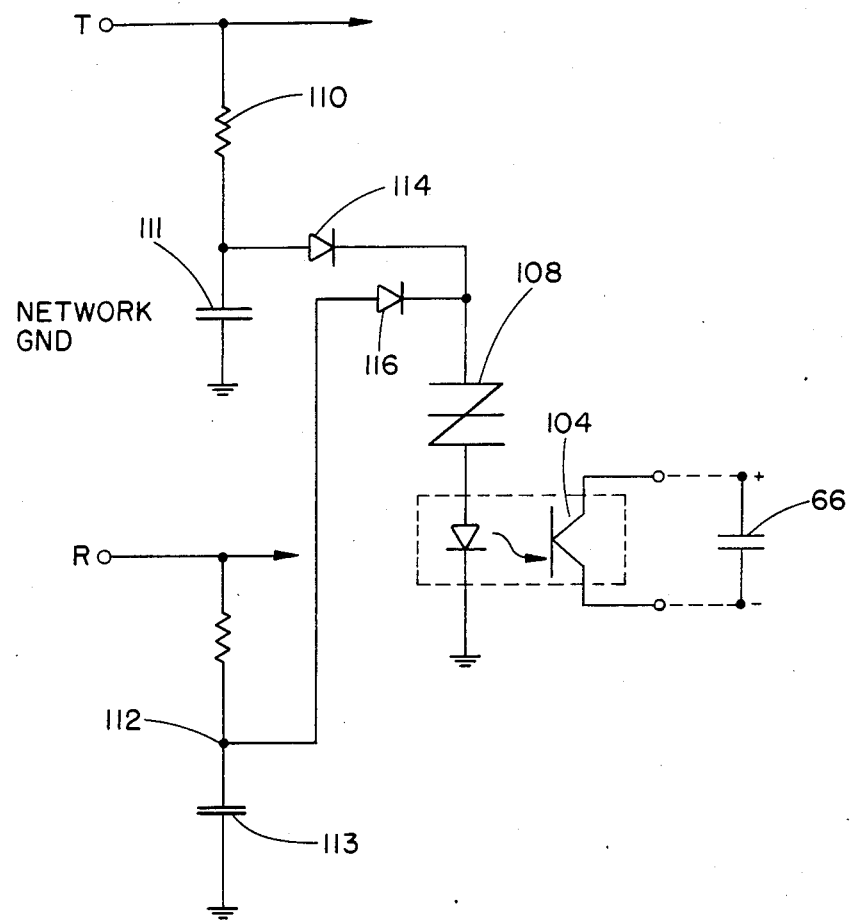
FIG. 5 is a schematic diagram of a discharge mechanism including a sidac for, a DC disconnect device.

An alternative discharging mechanism for use with a DC disconnect device is shown in FIG. 5 which includes a photo-transistor 104 connected across the capacitor 66. The transistor 104 is responsive to a LED 106 which is connected to a sidac 108 which may also be a silicon bilateral or unilateral switch. The sidac 108 is connected to both the tip and ring lines through an RC networks 110 and 112, respectively, and through forward biased diodes 114 and 116, respectively. The RC networks 110 and 112 provide AC immunity to the disconnect circuit by not allowing sufficient time for the capacitors 111 or 113 to change to the breakover voltage of the sidac 108. The connection of the discharge mechanism of FIG. 5 with the remote switch forms a dc disconnect device that enables the central office to disconnect the subscriber with a DC voltage.

For example, when the central office intends to test the line, it applies 130 volts DC , also known as coin battery, on the tip and/or ring line with respect to ground. Only under this condition of 130 volts dc applied for 4 seconds across the tip and/or ring with respect to ground does the capacitor 111 or 113 charge up to over the 100 volt breakover voltage of the sidac 108. In the event there is a fault condition where one of the lines is shorted to ground, the other line will permit its RC network 110 or 112 with its appropriate time constant to charge the capacitor to over 100 volts DC. The breakover voltage of the sidac 108 is set to be greater than the 100 volt test battery voltage to prevent the disconnect circuit from actuating while testing the line at 100 volts. The 100 volts DC, conducted through one of the forward biased diodes 114 or 116, respectively, allows the sidac 108 to breakover, which in its conduction mode has a fold back characteristic, and allows the charged capacitor or both capacitors 111 and/or 113 to discharge into the LED 106. The LED 106, through the light emission, turns on the phototransistor 104. The photo-transistor 104 may also be a photo-SCR or a photo-FET. Once the photo-transistor 104 is on, it then discharges the capacitor 66, which as previously described turns off the switch 10 accordingly for the time period it takes to charge up again. This charge time allows the central office test system to proceed to test the network side of the line without the customer equipment and its associated possible fault conditions connected to the line.

Figure 6A:
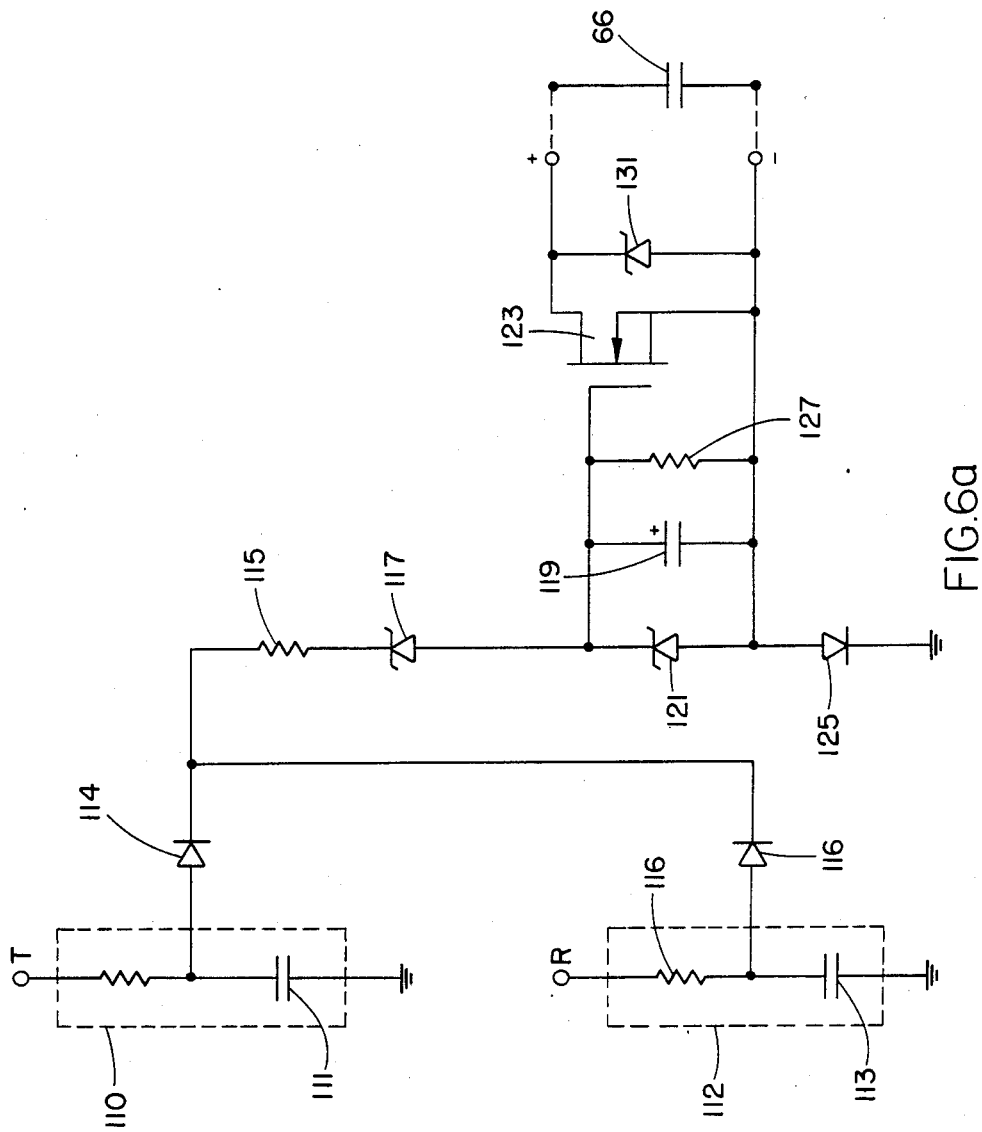
FIGS. 6a and 6b are schematic diagrams of additional discharge circuits for a DC disconnect device.

FIG. 6a is an alternative embodiment of the disconnect circuit shown in FIG. 5. RC networks 110 and 112 provide the AC immunity and diodes 114 and 116 reference the voltage to the avalanche device 117. As described in FIG. 5, the application of the 130 volts DC across tip and/or ring and ground will permit the capacitors 111 and 113 to charge to the breakover voltage of zener diode 117. When zener 117 avalanches, the voltage will begin to charge capacitor 119 to the voltage limited by zener diode 121 and the voltage divider formed with resistor 115. When capacitor 119 is charged, the voltage potential will be at the gate of FET 123 turning on FET 123 and placing the short across capacitor 66. Diode 125 provides the negative reference of the 130 volt coin battery to ground to permit the capacitor 119 to charge. When the coin battery voltage is removed, the capacitor 119 will discharge into resistor 127 and FET 123 will remain on for the time constant formed by capacitor 119 and resistor 127 maintaining the short across capacitor 44 for that time period. Zener diode 131 provides additional voltage protection to the FET 123.

Figure 6B:
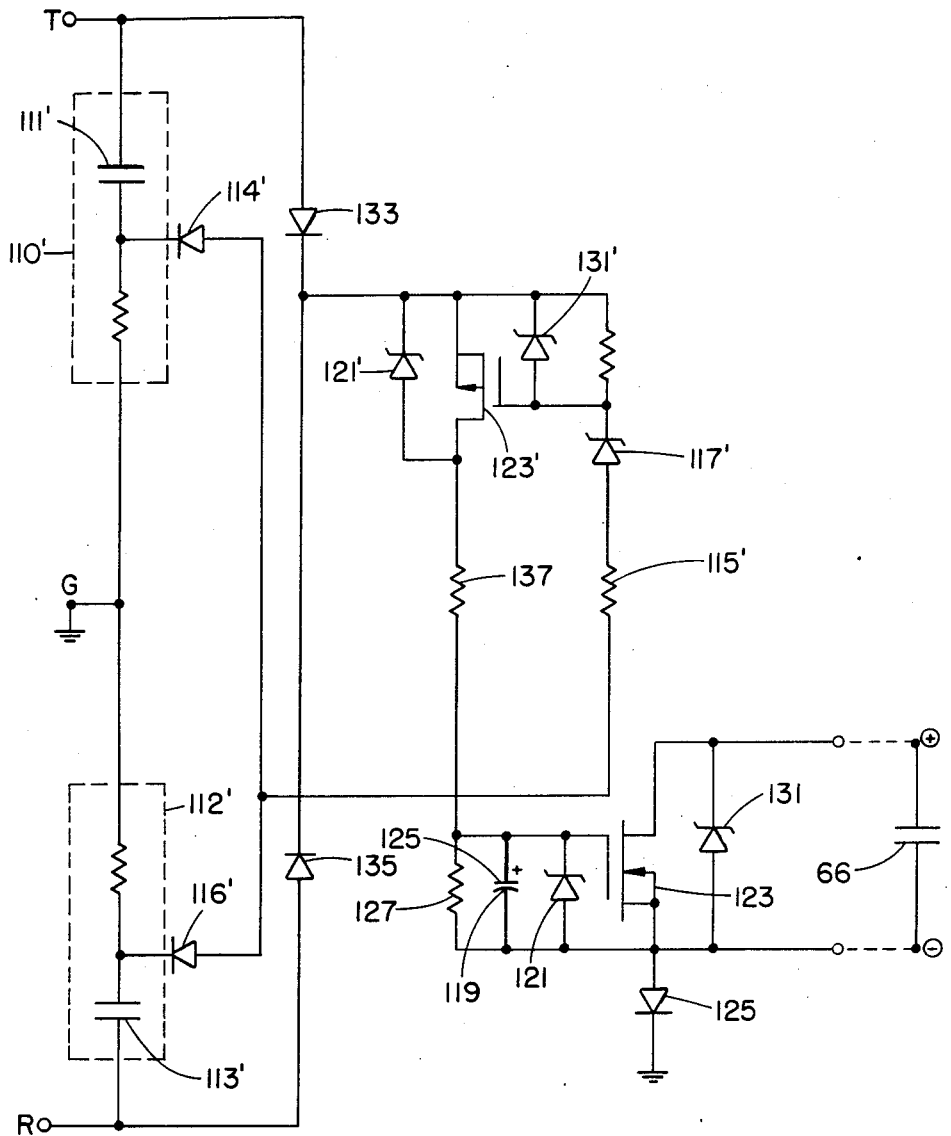

FIG. 6b is yet another embodiment of the DC disconnect circuit for shorting the capacitor 66. In the circuit of FIG. 6b the polarity of similar components shown in FIG. 6a has been reversed and therefore the components are designated with a prime. The RC networks 110' and 112' are connected with the capacitors 111' and 113' referenced to the tip and ring lines respectively. Diodes 114' and 116' provide the negative reference to ground for the p-channel FET 123' through resistor 115' and zener diode 117'. Similar to the operation of the circuits of FIGS. 5 and 6a as the 130 volt coin battery DC voltage is applied, the capacitors 111' or 113' will charge to the breakover voltage of avalanche device 117' causing the device 117' to conduct and place the negative potential to the gate of p-channel FET 123' to turn FET 123' on. Once FET 123' is turned on, the entire coin battery voltage will be conducted through diodes 133 or 135 to the FET 123' and will be divided across the voltage divider formed by resistor 137 and resistor 127 to ground through the diode 125. The voltage across resistor 127 will be limited by the zener diode 121 thereby charging capacitor 119 to the zener 121 voltage. With the FET 123' turned on, capacitor 144 will be discharged. The coin battery is then removed and the FET 123 will remain on for the time constant or resistor 127 and capacitor 119.

FIG. 7 shows a building block for a latching disconnect device wherein it is required to disconnect the subscriber and keep the subscriber disconnected for a substantial period of time. The latching circuit in FIG. 7 includes a bridge rectifier 130 including diodes 132, 134, 136 and 138 connected across tip and ring. A capacitor 140 is connected to the positive terminal 131 of the bridge 130 through a resistor 142, while the negative end of the capacitor 42 is connected to the negative end 133 of the bridge 130. An SCR 144 is connected to the positive end of capacitor 140 through a resistor 146. The cathode of SCR 144 is connected to the negative end of capacitor 140. Resistor 148 is connected across the gate of SCR 144 and the negative terminal of the bridge 130. Terminal 150 is connected to terminal 62 of the switch 10 shown in FIG. 1.

In operation, the bridge rectifier 130 keeps the capacitor 140 charged regardless of the polarity of the voltage across tip and ring. As mentioned above, when the central office wishes to disconnect the subscriber, the voltage across tip and ring is removed and the appropriate discharge mechanism is activated. The discharge mechanism is provided in a variety of forms illustrated earlier in FIG. 3a, 3b, 4, 5, 6a and 6b. In this example, the discharge mechanism instead of being connected across terminal 62 and 64 of FIG. 1, is connected across terminal 150 and 152 of the latching circuit. The discharge mechanism once energized will place a short across terminals 150 and 152 which will trigger and turn on SCR 144. SCR 144 will stay latched on as long there is a charge across capacitor 140. Even though there is no voltage across tip and ring the stored voltage in capacitor 140 sustains the SCR 144 in the on state until the tip and ring voltage is reapplied. With SCR 144 turned on there is a short applied between terminal 62 and the negative end 133 of the bridge rectifier 130, which produces a short between 62 and 64 to turn FET 38 off and keep it off. Terminal 64 is potentially the same negative potential as the negative end 133 of the bridge 130 and SCR 144. Thus, the customer will be disconnected for as long as there is voltage across tip and ring.

One use of the solid state switch 10, shown in FIG. 1, is in connection with a maintenance termination unit (MTU) remote disconnect device. The MTU also includes a termination circuit connected across tip and ring on the customer side of the switch 10. The termination circuit may include a resistor, zener diode and diode connected in series. The diode being poled to conduct only in the direction from ring to tip. The breakover voltage of the zener diode 36 of the switch 10 is below the 48 volts DC talk battery voltage and also well below the nominal 100 volt test battery and ringing voltage, so that in normal operation, the switches 12 and 12' will conduct. The telephone central office requires a means to provide a signature identifying the presence of a MTU in the circuit. One such means is shown in FIG. 8a wherein the zener diode 36 of FIG. 1 is replaced with two zener diodes 162 and 164 connected in series. The combined breakover voltage of the zener diodes 162 and 164 is equal to the breakover voltage of zener diode 36 of FIG. 1. For example, if the zener 36 of FIG. 1 is rated as 16 volts, then zeners 162 and 164 can be rated at 8 volts each. Additionally, there is an oscillator means 166 connected across the zener diode 164 that alternately applies and removes a short across zener diode 164 at a fixed rate. The voltage drop across terminals 32 and 33 will fluctuate between the zener voltage of zener diode 162 and the combined zener voltages of zener diodes 162 and 164. In the example, there will be a fluctuation of voltage between 16 and 18 volts which will be seen as an oscillation of impedance at the central office This oscillation or "wiggle," signifies to the central office that an MTU device is in the circuit. The oscillator 166 may be a commercially available flashing LED which has an internal oscillator. Instead of a short across zener 164 the voltage will fluctuate between the small LED voltage and the zener voltage of zener diode 164.

In another embodiment, an oscillator 168 may be connected to the gate 44 of the FET switch 38 in FIG. 1 forming a wiggle circuit 170. The oscillator 168 will alternately turn the FET 38 on and off which will cause the voltage across terminals 32 and 34 to fluctuate between the zener voltage of zener diode 36 and the combined zener voltages of zener diodes 36 and 48 to provide the wiggle at the central office. The oscillator will be powered by the stored charge across the capacitor 66. In this embodiment the oscillator 168 may include a C-MOS oscillator having an RC time constant to set the oscillation rate. The wiggle oscillator of FIGS. 8a and 8b can be placed in a termination circuit connected between tip and ring to provide a line to line wiggle.

In order to test the telephone line, the line is subjected to dc voltages applied across tip and ring, tip and ground, and ring and ground, in both polarities. The normal test battery of the "Local Test Desk" being 100 volts dc where as the MLT or Mechanical Loop Testing uses 60 volts dc to 70 volts dc. Yet another modified test voltage used in testing of a MTU consists of 10V, which is well below the threshold or trigger voltage of either of the switches 12, 12' in the MTU switch 10 of FIG. 1. At the start and between each test, by dropping the voltage and or the current to zero, the solid state switches 12, 12' will turn off, thereby disconnecting the customer and/or any impedance across the customer side of the line. Application of a test voltage greater than the trigger voltage of each solid state switch 12, 12', or the sum of trigger voltages of both the solid state switches 12, 12' enables the MTU making it look to the central office as if it were fully transparent except for the small forward voltage drop of the switches 12, 12'. Thus, all the impedances on the line, both on the central office and the customer side, are visible to the test system based in the central office. Also, when testing in the polarity from ring to tip, at the higher test battery voltage, a termination circuit, not shown, would be visible to the central office test system. Now, by testing the line at the lower test voltage, namely at 10 volts, the test system sees the network or the central office side of the line only, and the termination circuit will not be visible regardless of the polarity of the test voltage. This also confirms the presence of the MTU, while permitting the analysis of the presence of both the normal and the abnormal impedances on the line while separating the ones on the customer side of the line from the central office side of the line.

Figure 9:
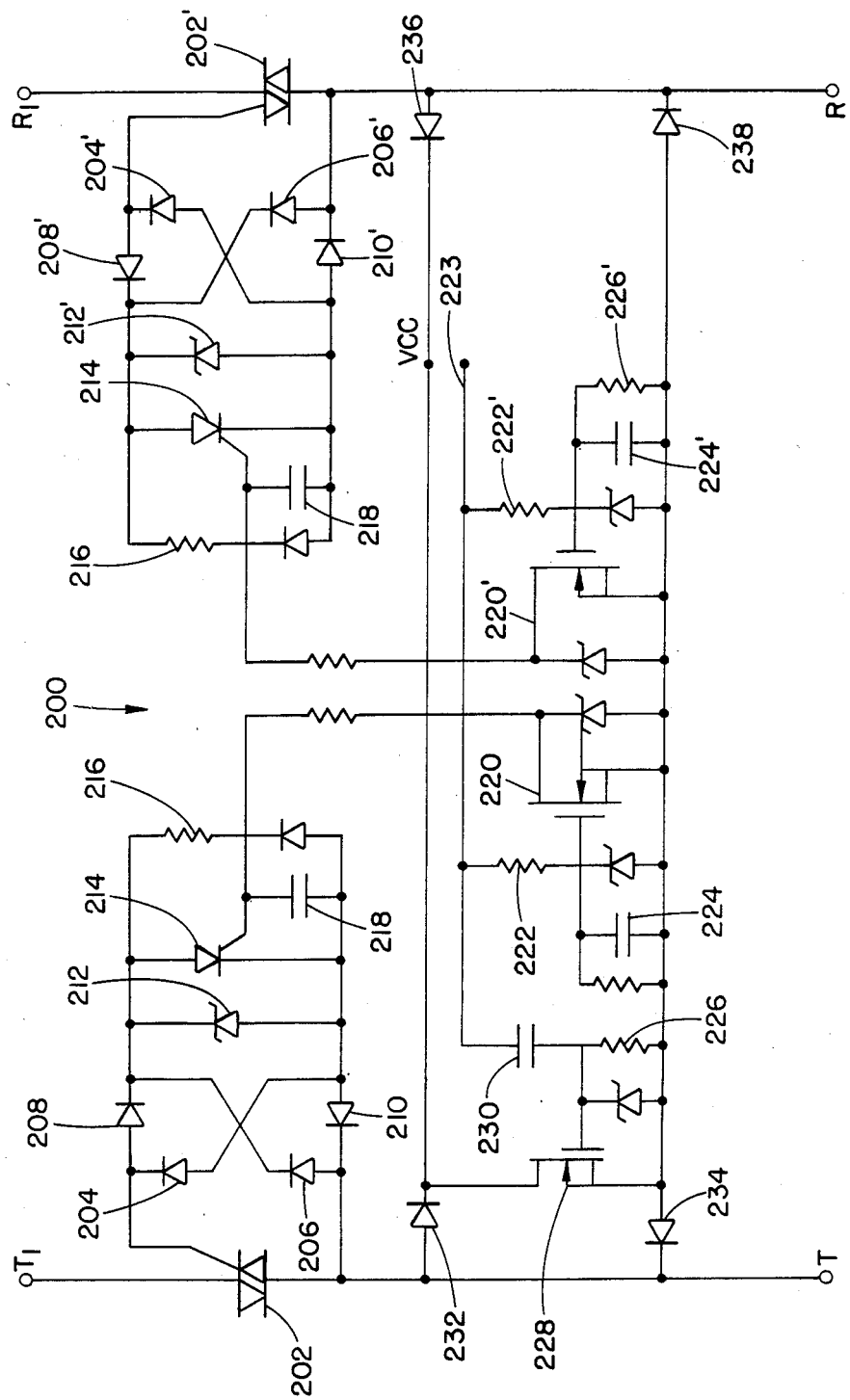
FIG. 9 is a schematic diagram of non-exclusion disconnect switch.

A further use of the remote solid state switch 10 is in a multi-party line for selectively ringing a specific party. The switch 10 of FIG. 1 connected within the tip and ring lines of each party of the multi-party system provides exclusive use of the multi-party line to the party who has seized the line. In the off hook condition, the tip to ring voltage drops below the combined threshold voltage of the zener diodes 36 and 36'. Thus, when one party is off hook, there will not be sufficient voltage to trigger the switches 10 of any of the remaining parties thereby excluding those parties from using the line. The circuit shown in FIG. 9 shows a modified switch of FIG. 1 that is non-excluding, since any party may come on the line by going off-hook even if another party is already using the line The switch 200 of FIG. 9 includes bilateral switches 202 and 202' connected within the tip T and ring R lines of each party. For simplicity, only the elements on the tip line will be described, it being understood that corresponding elements designated with a prime are within the ring line. A diode bridge formed by diodes 204, 206, 208 and 210 is connected between the gate and one terminal of the switch 202. Connected across the diode bridge are zener diode 212 and SCR 214, the SCR 214 replacing the FET 38 of FIG. 1. The zener diode 212 is a protective diode to protect SCR 214 from overvoltage. Resistor 216 connects the diode bridge to the gate of the SCR 214 to limit the current for triggering the SCR 214. A capacitor 218 is connected to the gate of the SCR 214 for delaying the turn on of the SCR 214, until the capacitor 218 is charged.

The discharge mechanism includes unilateral switches 220 and 220' that when conducting will short the capacitors 218 and 218', respectively, thereby turning off the SCRs 214 and 214'. The switches 220 and 220' are turned on through resistors 222 and 222' by a control voltage placed on the control lead 223 remotely by the central office. A circuit means, not shown, is provided to connect the control lead to node $V^{cc}$ to apply the control voltage across tip and ring to the control lead. Capacitors 224 and 224' keep the switches 220 and 220' on for the RC time constant determined by resistors 226 and 226' after the threshold voltage required to turn on the switches 202 and 202' has been removed.

To turn the switches 202 and 202' off, unilateral switch 228 places a short across the tip and ring for a short period, such as one second. Switch 228 is turned on by the control voltage from the central office through a capacitor 230. A diode bridge formed by diodes 232, 234, 236 and 238 permits the switch 228 to be turned on regardless of the polarity of tip and ring.

The circuit of FIG. 9 is nonexcluding by permitting the switches 202, 202' to turn on with a very low threshold voltage which can be as low as 2 volts are each switch. In a party line environment, with 1 party offhook, the voltage across the line in some cases may be as low as 4 volts. This may occur in the case where two phones on the one party's extention are being used at the same time. This will result in a very low voltage across tip and ring which would not be sufficient to turn on the triacs 12 of the switch of FIG. 1 because of the breakover voltages available in each device 36 of FIG. 1. In FIG. 9, the avalanche 36 is eliminated which reduces the threshold voltage required to turn on the switch 202 to approximately 2 volts. The circuit to turn on switch 202 includes two diode drops in the bridge rectifier circuit, a diode drop in the triac 202 and a the gate cathode diode drop of the SCR 214 which totals approximately 2 volts. Therefore, switch 200 permits any party of the multi-party line to break into the line already in use because there will always be sufficient voltage on the line to trigger the switch 202, 202'.

While illustrative embodiments of the subject invention have been described and illustrated, it is obvious that various changes and modifications can be made therein without departing from the spirit of the present invention which should be limited only by the scope of the appended claims.

What is claimed is:

1. A remotely actuable switch for use in a remote telephone circuit, said remote switch providing a remote disconnect for a telephone subscriber in response to a control signal from a central office, said switch comprising:
   at least one solid state bilateral switch having a first and a second terminal connected in series with said remote telephone circuit, and a gate for rendering the switch conductive between said terminals in response to a predetermined current level,
   a solid state unilateral switch for each bilateral switch, said unilateral switch having first and second terminals and a gate for actuating the unilateral switch between said terminals in response to a predetermined control voltage,
   a diode bridge circuit having positive and negative terminals for connecting the gate and second terminal of the bilateral switch to the first and second terminals of the unilateral switch, said bridge providing the proper polarity to the unilateral switch regardless of the polarity of the telephone circuit,
   a solid state avalanche device connected between the first terminal of the unilateral switch and the positive terminal of the bridge circuit,
   a circuit means for supplying a predetermined control voltage for actuating said unilateral switch in response to a control signal from the central telephone office.

2. A remote switch as claimed in claim 1 wherein said circuit means includes a second unilateral switch which is actuated by a predetermined control voltage supplied by the central telephone office.

3. A remote switch as claimed in claim 1 wherein said circuit means includes at least one frequency tone detector which is actuated by a tone generator at the central telephone office.

4. A remote switch as claimed in claim 1 wherein said circuit means includes a polarity verification means which is actuated by a polarity encoding imposed on a control signal from the central telephone office.

5. A remote switch as claimed in claim 4 wherein said encoded control signal includes a polarity combination of an AC ring voltage and a DC battery voltage.

6. A remotely actuable switch for use in a telephone circuit, said remotely actuable switch providing a remote disconnect for a telephone subscriber in response to a control signal from the central office, said switch being normally transparent and conductive for voltages and currents normally encountered on said telephone circuit, said switch comprising:
   at least one solid state bilateral switch having first and a second terminal connected in series with said telephone circuit, and a gate for rendering the switch conductive between said terminals in response to a gate trigger circuit level and responsive to a switch hold current level to sustain conduction,
   a solid state unilateral switch for each bilateral switch connected between the gate of said bilateral switch and said telephone circuit, said unilateral switch having first and second terminals and a gate for actuating the unilateral switch between said terminals in response to a normal telephone operative voltage, said unilateral switch being selectively rendered nonconductive in response to a control signal from the central office to disable said bilateral switch, a diode bridge circuit for each bilateral switch having positive and negative terminals for connecting the gate and second terminal of the bilateral switch to the first and second terminals of the unilateral switch, said bridge providing the proper polarity to the unilateral switch regardless of the polarity of the telephone circuit, a solid state avalanche device for each bilateral switch connected between the first terminal of the unilateral switch and the positive terminal of the bridge circuit, said avalanche device being responsive to a predetermined threshold voltage to render said bilateral switch voltage sensitive, a circuit means for each unilateral switch for supplying said normal telephone operative voltage for actuating each of said unilateral switches, said bilateral switch being rendered nonconductive by dropping said circuit current level below said switch hold current level and sustained nonconductive in response to said control signal, said bilateral switch being rendered conductive only in the presence of a voltage greater than said threshold voltage level in the absence of said control voltage.

7. The remotely actuable switch of claim 6, further including a disconnect circuit means for rendering said unilateral switch nonconductive in response to a control signal from the central office.

8. The remote switch as claimed in claim 7, wherein said disconnect circuit means includes a second unilateral switch which is actuated by a control voltage supplied by the central telephone office.

9. The remote switch as claimed in claim 8, wherein said disconnect circuit means includes at least one frequency tone detector which is actuated by a tone signal generated by the telephone central office.

10. The remote switch as claimed in claim 8, wherein said disconnect circuit means includes a voltage and polarity detector which is actuated by a polarity encoding imposed on a control signal from the telephone central office.

11. The remote switch as claimed in claim 6, further including a wiggle circuit means connected between said avalanche device and the first terminal of each of said unilateral switches.

12. The remote switch as claimed in claim 11 wherein said wiggle circuit includes a second avalanche device connected in series with said first avalanche device and an oscillating means connected across said second avalanche device for alternately applying a short across said second avalanche device.

13. The remote switch as claimed in claim 12 wherein said oscillating means is connected to the gate of said solid state unilateral switch for alternately actuating and de-actuating said unilateral switch.

14. The remote switch of claim 1, further including a second diode bridge connected between the gates of a pair of unilateral switches for a remote switch having a pair of solid state bilateral switches.

15. The remote switch of claim 14, further including a capacitor connected between the positive and negative terminals of the second diode bridge.

16. The remote switch of claim 15, further including a disconnect circuit means connected across said capacitor for shorting said capacitor in response to a control signal from the central office for rendering said unilateral switch nonconductive.

17. The remote switch of claim 16, wherein said disconnect circuit means includes a latching circuit.

18. The remote switch of claim 17, wherein said latching circuit includes an SCR having an anode, cathode and gate terminals, said anode and cathode being connected across the positive and negative terminals of the second bridge circuit, the anode and the gate being connected across said disconnect circuit means, and a resistor connected between said anode and the positive terminal of said second bridge circuit.

19. The remote switch of claim 17, wherein said latching circuit includes an SCR having an anode, cathode and gate terminals, said anode and cathode being connected across the positive and negative terminals of the second bridge circuit, the anode and the gate being connected across said disconnect circuit means, a resistance-capacitance time constant circuit connected across said anode and cathode for sustaining said SCR in the on state for the time that said capacitor is charged, a third bridge rectifier circuit connected to said capacitor through a resistor for charging said capacitor in response to a voltage across tip and ring.

20. The remotely actuable switch of claim 6 further including a second avalanche device connected across the first and second terminals of said unilateral switch.

21. A remotely actuable switch for use in a telephone circuit, said remote switch providing a remote disconnect for a telephone subscriber in response to a control signal from the central office, said switch comprising:

at least one solid state bilateral switch means connected in series with said telephone circuit said switch normally passing both DC and AC signals in response to a pilot signal;

a field effect transistor switch means for each bilateral switch, said FET switch means being responsive to a normal telephone voltage from the central office to generate a pilot signal to normally enable said solid state bilateral switch means, said FET being selectively disabled in response to a control signal from the central office to thereby open said bilateral switch;

a diode bridge circuit for each bilateral switch connected between the bilateral switch means and the FET switch means to provide the proper polarity to the FET switch regardless of the polarity of the normal operative telephone signal;

whereby said telephone subscriber is disconnected from the telephone circuit in response to said control signal.

22. The remotely actuable switch of claim 21 further including a solid state avalanche device for each bilateral switch connected between FET switch and the bridge circuit, said avalanche device being responsive to a predetermined threshold voltage to render said bilateral switch voltage sensitive.

23. The remotely actuable switch of claim 22 including:

two of said Fets for each bilateral switch, said two FETs including an n-channel and a p-channel FET, said n-channel and p-channel FETs being connected in series with each other between the gate of said bilateral switch and said telephone circuit;

two of said solid state avalanche devices for each bilateral switch connected between the first terminal of one of the unilateral switches and the gate of the bilateral switch, said avalanche devices being oppositely poled to render said bilateral switch voltage sensitive in any polarity; and two of said resistance-capacitance, time constant circuits for each pair of FETs.

24. A remotely actuable switch for use in a multiparty telephone circuit, said switch providing a remote disconnect for a telephone subscriber in response to a control signal from a telephone central office, said switch permitting any party of the multiparty telephone line to have access to the telephone line while one or more other parties of the multi-party line are using the line, said switch being normally transparent and conductive for voltages and currents normally encountered on said telephone circuit, said switch comprising:

at least one solid state bilateral switch having first and second terminals connected in series with said telephone circuit and a gate for rendering the switch conductive between said terminals in response to the gate trigger current;

a diode bridge circuit for each bilateral switch having positive and negative terminals connected between the gate and the second terminal of said bilateral switch;

a silicone controlled rectifier having an anode and cathod terminals connected across the positive and negative terminals of the diode bridge and a gate for rendering the SCR conductive in response to the control voltage from the telephone central office; and circuit disconnect means connected to the gate of said SCR for selectively rendering said SCR nonconductive to disable said bilateral switch.

25. The remotely actuable switch of claim 24 further including a circuit means for rendering said SCR conductive for said normal telephone voltages and currents.

26. The remotely actuable switch of claim 25 further including a capacitor connected across the gate and the cathode of the SCR for delaying the turn on of said SCR.

27. The remotely actuable switch of claim 26 wherein said circuit means includes means for rendering said bilateral switch nonconductive.

28. The remotely actuable switch of claim 8 wherein said circuit disconnect means includes a resistance capacitor time constant circuit connected between each tip and ring circuit and ground, each of the RC circuits being connected to an avalanche device for energizing said second unilateral switch in response to a DC control voltage.

29. The remotely actuable switch of claim 28 wherein said avalanche device is a bilateral solid state switch.

30. The remotely actuable switch of claim 29 wherein said circuit disconnect means further includes a LED being energized by a sidac and wherein said second unilateral switch is a photosensitive device optically coupled to said LED.

31. The remotely actuable switch of claim 30 wherein said photosensitive device is a phototransistor.

32. The remotely actuable switch of claim 29 wherein said solid state bilateral switch is a sidac.

33. The remotely actuable switch of claim 29 wherein said avalanche device is a zener diode.

34. The remotely actuable switch of claim 33 wherein said unilateral switch includes a field effect transistor having source and drain terminals connected across said capacitor in said first RC circuit, and a gate connected to said avalanche device, a fourth resistance-capacitance circuit connected to the gate of said FET for energizing said FET, a second avalanche device connected across said fourth RC circuit, and a third avalanche device connected across the source and drain terminals of said FET.

35. The remotely actuable switch of claim 34 further including a second unilateral switch connected series between the tip and ring lines and the gate of said first unilateral switch, said second unilateral switch being rendered conductive in response to said first avalanche device becoming conductive, said second unilateral switch passing the entire DC control signal to said first unilateral switch for energizing said first unilateral switch.

36. A switch actuation circuit for activating a pilot switch in response to a control signal from a telephone central office, said circuit comprising:

a capacitor connected across said pilot switch for normally energizing said pilot switch in response to a contol voltage;

a discharge means for discharging said capacitor in response to a predetermined control signal; and a detecting means for actuating said discharge means in response to said predetermined control signal from said central office;

whereby said pilot switch is opened by the discharge of said capacitor.

37. The switch actuation circuit of claim 36 wherein said discharge means is a field effect transistor having source and drain terminals connected across said capacitor.

38. The switch actuation circuit of claim 37 wherein said detecting means includes a tone detector actuated by a tone signal generated by the central office.

39. The switch actuation circuit of claim 36 wherein said detecting means includes a voltage and polarity detector actuated by polarity encoding imposed on a control signal from the central office.

40. The switch actuation circuit of claim 36 wherein said detecting means includes a DC and voltage sensitive circuit means actuated by a DC control voltage generated by the central office.

* * * * *